(12) United States Patent
Bowden et al.

(10) Patent No.: US 6,507,989 B1
(45) Date of Patent: Jan. 21, 2003

(54) SELF-ASSEMBLY OF MESOSCALE OBJECTS

(75) Inventors: Ned B. Bowden, Somerville, MA (US); Andreas W. Terfort, Halstenbek (DE); Jeffrey D. Carbeck, Princeton, NJ (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 08/816,662

(22) Filed: Mar. 13, 1997

(51) Int. Cl.⁷ .................................................. H01S 4/00
(52) U.S. Cl. ...................................................... 29/592.1
(58) Field of Search .................................. 29/592.1, 729

(56) References Cited

U.S. PATENT DOCUMENTS

| | | | | |
|---|---|---|---|---|
| 5,075,253 A | * | 12/1991 | Sliwa, Jr. ..................... | 438/109 |
| 5,355,577 A | * | 10/1994 | Cohn ........................... | 29/592.1 |
| 5,545,291 A | | 8/1996 | Smith et al. ............... | 156/655.1 |
| 5,925,259 A | * | 7/1999 | Biebuyck et al. ........... | 216/2 |
| 6,001,232 A | * | 12/1999 | Chu et al. ................... | 204/455 |

OTHER PUBLICATIONS

Mariko Yamaki et al., "Size-Dependent Separation of Colloidal Particles In Two-Dimensional Convective Self-Assembly," *Langmuir*, vol. 11, No. 8, pp. 2975–2978, 1995.

Chad A. Mirkin et al., "A DNA-based method for rationally assembling nanoparticles into macroscopic materials," *Nature*, vol. 382, pp. 607–609, Aug. 15, 1996.

Peter A. Kralchevsky et al., "Capillary Forces between Colloidal Particles," *Langmuir*, vol. 10, No. 1, pp. 23–36, 1994.

T. Schober et al., "Proton implantation into GaAs: Transmission electron microscopy results," *J. Appl. Phys.*, vol. 71, No. 5, pp. 2206–2210, Mar. 1, 1992.

A.W. Simpson et al., "Bubble Raft Model for an Amorphous Alloy," *Nature*, vol. 237, pp. 320–322, Jun. 9, 1972.

Andreas Terfort, et al., "Three-dimensional self-assembly of millimetre-scale components," *Nature*, vol. 386, pp. 162–164, Mar. 13, 1997.

* cited by examiner

*Primary Examiner*—Carl J. Arbes
(74) *Attorney, Agent, or Firm*—Wolf, Greenfield & Sacks, P.C

(57) ABSTRACT

Self-assembling systems include component articles that can be pinned at a fluid/fluid interface, or provided in a fluid, or provided in proximity of a surface, and caused to self-assemble optionally via agitation. A self-assembling electrical circuit is provided.

22 Claims, 12 Drawing Sheets

SELF-ASSEMBLY OF MESOSCALE OBJECTS

FIELD OF THE INVENTION

The present invention relates generally to self-assembly, and more particularly to surface-selective self-assembly of component articles, including those spanning the micron to centimeter range and optionally including electronic circuitry, into composite articles.

BACKGROUND OF THE INVENTION

Self-assembly is a term used to define the spontaneous association of entities into structural aggregates. The best-known and most well-researched area of self-assembly involves molecular self-assembly, that is, the spontaneous association of molecules, a successful strategy for the generation of large, structured molecular aggregates. Self-assembly of molecules in solution is described by Whitesides, et al., in "Noncovalent Synthesis: Using Physical-organic Chemistry to Make Aggregates", *Accts. Chem. Res.*, 28, 37–44 (1995). See also Philp, et al., *Angew. Chem., Int. Ed. Engl.*, 35, 1155–1196 (1996) for molecular self-assembly. Nature includes examples of molecular self-assembly where, in the field of biology, many processes involve interfacial interactions and shape selectivity to form complex, three-dimensional structures.

Self-assembly of molecules can be made to occur spontaneously at a liquid/solid interface to form a self-assembled monolayer of the molecules when the molecules have a shape that facilitates ordered stacking in the plane of the interface and each includes a chemical functionality that adheres to the surface or in another way promotes arrangement of the molecules with the functionality positioned adjacent the surface. U.S. Pat. No. 5,512 131, and U.S. patent application Ser. Nos. 08/695,537, 08/616,929, 08/676,951, and 08/677,309, and International Patent Publication No. WO 96/29629, all commonly-owned, describe a variety of techniques for arranging patterns of self-assembled monolayers at surfaces for a variety of purposes. See also Whitesides, G. M., "Self-Assembling Materials", *Scientific American*, 273, 146–149 (1995) for a discussion of self-assembly.

Self-assembly of components larger than molecules is known, for example, self-assembly of bubbles at an air-liquid interface, small spheres self-assembled on surfaces, self-assembly of microspheres via biochemical attraction between the microspheres, and the like. In "A DNA-Based Method for Rationally Assembling Nanoparticles Into Macroscopic Materials", *Nature*, 382, (Aug. 15, 1996), Mirkin, et al., describe a technique for assembling colloidal gold nanoparticles, reversibly, into macroscopic aggregates. Non-complementary DNA oligonucleotides capped with thiol groups that bind to gold are attached to the surface of batches of 13 nm gold particles. When the particles are placed into a solution to which is added an oligonucleotide duplex with "sticky ends" complementary to the two grafted sequences, the nanoparticles self-assemble into aggregates. The assembly can be reversed by thermal denaturation. Yamaki, et al., in "Size Dependent Separation of Colloidal Particles in Two-Dimensional Convective Self-Assembly" *Langmuir*, 11, 2975–2978 (1995), report "convective self-assembly" of colloidal particles ranging in size from 12 nm to 144 nm in diameter in a wetting liquid film on a mercury surface. Size-dependent two-dimensional convective assembly occurred, with larger particles being positioned in the center of the aggregate and smaller particles at the periphery. Cralchevski, et al., in "Capillary Forces Between Colloidal Particles" *Langmuir*, 10, 23–36 (1994), describe capillary interactions occurring between particles protruding from a liquid film due to the capillary rise of liquid along the surface of each particle. A theoretical treatment of capillary forces active spheres is presented. Simpson, et al., in "Bubble Raft Model for an Amorphous Alloy", *Nature*, 237–322 (Jun. 9, 1972), describe preparation of a two-dimensional amorphous array of bubbles of two different sizes as a model of an amorphous metal alloy. The bubbles were held together by a general capillary attraction representative of the binding force of free electrons in the metal.

U.S. Pat. No. 5,45,291 (Smith) describes assembly of solid microstructures in an ordered manner onto a substrate through fluid transfer. The microstructures are shaped blocks that, when transferred in a fluid slurry poured onto the top surface of a substrate having recessed regions that match the shapes of the blocks, insert into the recessed regions via gravity. U.S. Pat. No. 5,355,577 (Cohn) describes a method of assembling discrete microelectronic or micro-mechanical devices by positioning the devices on a template, vibrating the template and causing the devices to move into apertures. The shape of each aperture determines the number, orientation, and type of device that it traps.

While self-assembly at the molecular level is relatively well-developed, self-assembly at larger scales is not so well-developed. Many systems in science and technology require the assembly of components that are larger than molecules into assemblies, for example, microelectronic and microelectrochemical systems, sensors, and microanalytical and microsynthetic devices. Photolithography has been the principal technique used to make microstructures. Although enormously powerful, photolithography cannot easily be used to form non-planar and three-dimensional structures, it generates structures that are metastable, and it can be used only with a limited set of materials. Accordingly, it is an object of the present invention to provide techniques for the rational self-assembly of component articles into composite structures according to predetermined arrangements.

SUMMARY OF THE INVENTION

The present invention provides techniques for self-assembly of component articles. In one aspect, the invention provides a method of self-assembly including providing a first component article having a maximum dimension, a total surface area, and a first mating surface. A second component article is provided that also has a maximum dimension, a total surface area, and a second mating surface that matches the first mating surface of the first component article. The first and second mating surfaces each define an area equal to at least 1% of the lesser of the total surface areas of the first and second component articles. Preferably, the first and second mating surfaces each define an area equal to at least 5% of the lesser of the total surface areas of the first and second component articles, more preferably at least 10%. The first and second component articles are separated by a distance at least equal to $\frac{1}{100}$ of the maximum dimension of the first or second component article, preferably separated by a distance at least equal to $\frac{1}{50}$ the maximum dimension, preferably at least $\frac{1}{25}$, and more preferably still a distance at least equal to the maximum dimension. Then, without applying a net external force to either of the first and second component articles, and under set conditions, the first mating surface is allowed to fasten to the second mating surface in a manner that is irreversible under the set conditions. A composite article of the first and second component articles is thereby formed. In another embodiment the method involves allowing the first and second mating surfaces to mate in the presence of a net external force. A third component article can be added to the system and the method can involve allowing a mating surface of the third article to fasten to the mating surface of the second component, irreversibly under the set conditions.

According to another embodiment the invention involves a method of self-assembly that includes first and second component articles each including a total surface area, a first mating surface, and a remainder surface. The first and second mating surfaces each are compatible with the other and are incompatible with the remainder surfaces. Without applying a net external force to either of the first and second component articles, and under set conditions, the first mating surface is allowed to fasten to the second mating surface irreversibly under the set conditions.

In another embodiment, the invention provides a method of self-assembly in which first and second component articles are provided each having a dimension of at least 150 nm, a total surface area, and a mating surface. The mating surfaces of the respective component articles match, and each define an area equal to at least 1% of the lesser of the total surface areas of the first and second component articles. Without applying a net external force to either of the first and second component articles, the first and second mating surfaces are allowed to fasten to each other. A composite article is formed thereby via connection of the first and second mating surfaces.

According to another aspect of the invention a self-assembled article is provided. The article is a self-assembled composite of a plurality of separate component articles joined at respective matching mating surfaces. The component articles each have a dimension of at least 150 nm.

According to yet another aspect an electrical circuit is provided in the invention. The electrical circuit comprises a self-assembled composite of a plurality of separate component circuit articles that are joined at respective matching mating surfaces. A plurality of the separate component circuit articles each include an electrical conductor in electrical communication with an electrical conductor of an adjacent component article in the circuit to which it is fastened via self-assembly.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure.

DETAILED DESCRIPTION OF THE INVENTION

The present invention provides techniques for self-assembly of greater-than-molecular-scale components into composite articles, and composite articles formed via self-assembly of these components. Self-assembly can be conducted in the absence of an external net force according to a first set of embodiments of the invention, and with the aid of an external net force according to another set of embodiments. As used herein, "external net force" is meant to define a non-random force applied to a self-assembling component, in the direction of a second self-assembling component, for a period of time sufficient to cause the components to mate. Examples of non-random, external net forces include a mechanical force applied to a component selectively, application of an electric or magnetic field to a component susceptible to such a field, the use of gravity to cause self-assembly to occur, and the like. Self-assembly can be facilitated by application to a system of energy that does not constitute an external net force, as defined above, for example agitation of a system allowing random component-component interactions leading to self-assembly as described below. In another aspect, no energy is applied to a system and self-assembly occurs spontaneously over time.

Figure 1:
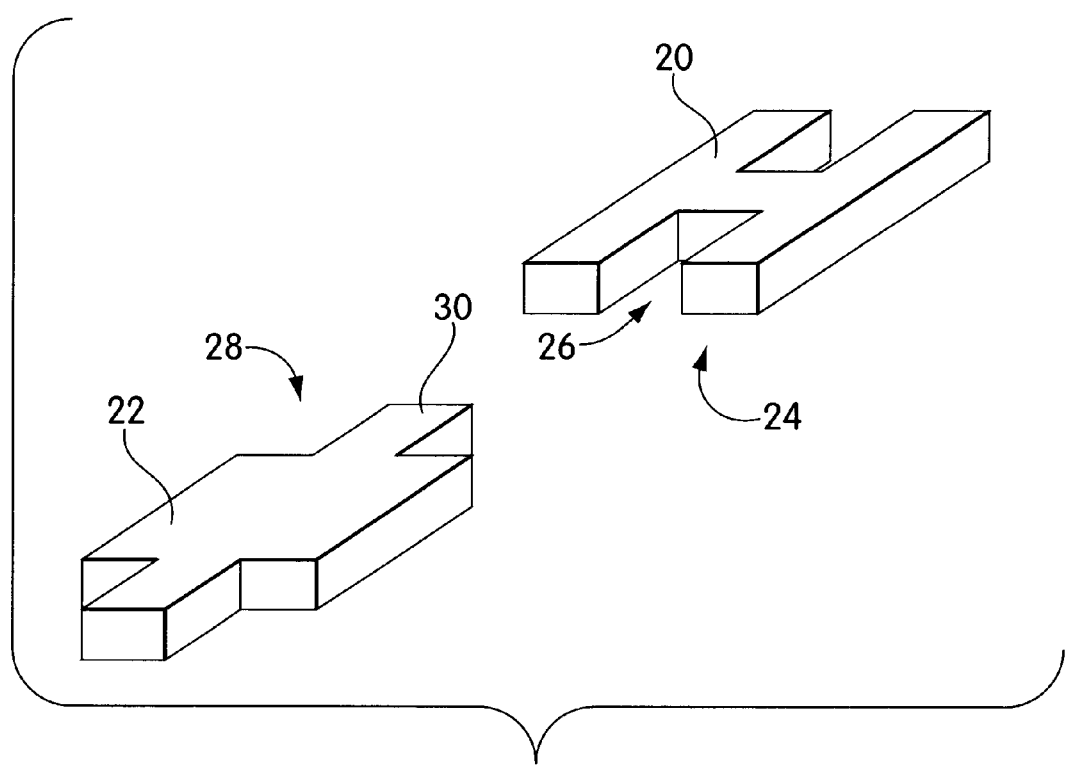
FIG. 1 is a schematic illustration of two self-assembling component articles each having a mating surface that matches, in dimension and in shape, the mating surface of the other article.

FIG. 1 illustrates, schematically, two self-assembling components 20 and 22 constructed for selective self-assembly. "Selective self-assembly" is meant to define self-assembly of two components via predetermined mating surfaces, selectively, while avoiding assembly of the components via surfaces other than their mating surfaces. More than two components can be involved, as described below. A "mating surface" is a surface of a component that is shaped in a predetermined manner and/or otherwise adapted to mate selectively with a mating surface of another component. In preferred embodiments, mating surfaces are shaped to mate with mating surfaces of other components, and also expose a chemical mating surface functionality that promotes self-assembly via adhesion, via reduction of free energy of the overall system, or a combination. In FIG. 1, component 20 includes a mating surface 24 including an indentation 26 and component 22 includes a mating surface 28 including a protrusion 30 that is sized to be insertable within indentation 26 of mating surface 24. That is, mating surfaces 24 and 28 match in that, when brought together, the mating surfaces are essentially completely in contact. By "essentially completely in contact", it is meant that contact between the mating surfaces is achieved over at least 50% of the entire mating surface contact area, preferably at least 70%, more preferably at least 90%, and more preferably still at least 95%. Perfect contact between mating surfaces is not achieved since the surfaces are not atomically smooth and, indeed, in some circumstances the mating surfaces need not even approach such smoothness. Depending upon the particular configuration of the mating surfaces, greater contact may inherently be necessary. For example, in many cases the contacting surfaces should be quite smooth because, if rough, the lateral motion required to achieve self-correction and good register between the mating surfaces could be prevented.

Figure 2:
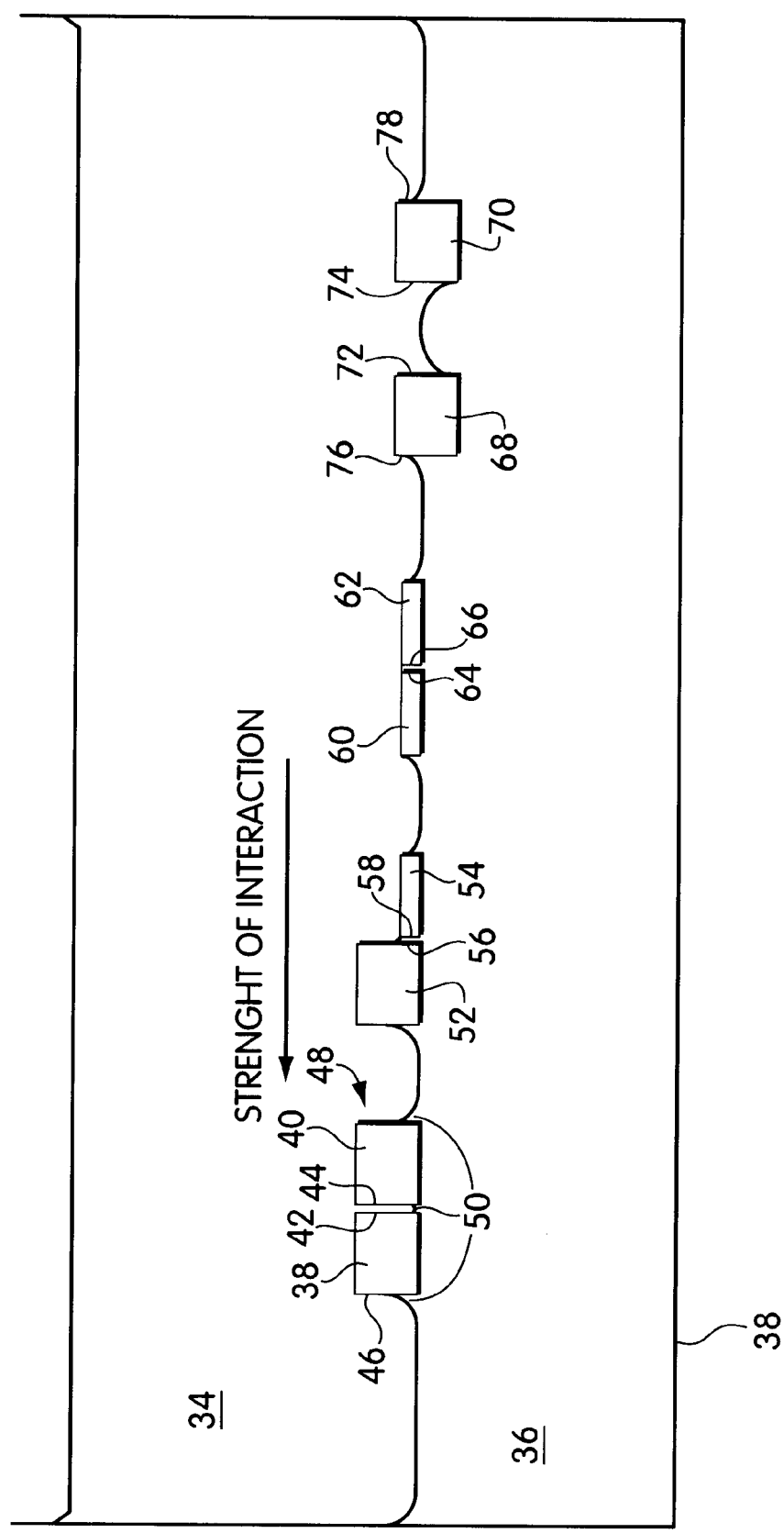
FIG. 2 is a schematic illustration of two-dimensional self-assembly at a fluid/fluid interface.

One technique for self-assembly of component articles having matching mating surfaces is illustrated schematically in FIG. 2. In this technique a two-fluid system, including a first fluid 34 and a second fluid 36 incompatible with fluid 34, is provided in a container 38. First and second fluids 34 and 36 typically differ in polarity to the extent that they readily phase-separate spontaneously. This phenomenon, and selection criteria for spontaneous phase separation, are well-known to those of ordinary skill in the art. Fluids 34 and 36 should differ in density to the extent that a two-phase combination is achieved relatively quickly upon combination of the two fluids, rather than formation of a relatively stable emulsion. Again, those of ordinary skill in the art can select fluids of adequate difference in density, and the difference in density generally will be greater than at least 10%. The denser of the two fluids can be water or another aqueous solution or mixture and the less dense fluid 34 can be a hydrocarbon (such as an alkane e.g. hexane, heptane, octane, etc.) either linear, branched, cyclic, or aromatic, optionally including heteroatoms and/or auxiliary functional groups, or in another embodiment the denser of the fluids 36 can be a more-dense organic fluid such as a fluorinated hydrocarbon and the less-dense fluid 34 can be aqueous. As a specific example, fluid 34 can be water and fluid 36 can be perfluorodecalin ($C_{10}F_{18}$). As another specific example, fluid 36 can be water and fluid 34 can be hexane, or in another specific embodiment fluid 36 can be water and fluid 34 can be air or another gas.

According to the technique, a first self-assembling component 38 and a second component 40 are placed in the fluid mixture and are pinned at the interface between the two fluids. This is facilitated by selection of components 38 and 40 that have a density not significantly less than the less-dense fluid 34 and not significantly more than the more-dense fluid 36, and chemical functionality that promotes pinning at the interface. Again, selection can be made by those of ordinary skill in the art according to these criteria. Typically, component articles 38 and 40 will have a density between the densities of fluids 34 and 36, or just slightly outside of that range. The density of the articles can be adjusted readily by adding dense additives (such as metal to a non-metal component) or creating voids within the articles.

Articles 38 and 40 have mating surfaces 42 and 44, respectively, and remaining surfaces 46 and 48, respectively. "Remaining surfaces" is meant to define all surfaces of the article not defined by the mating surfaces. Self-assembly is achieved by selecting components 38 and 40 having mating surfaces 42 and 44 that are chemically compatible, selectively, with one of the fluids 34 or 36. If the self-assembling objects are light, that is, have a density similar to that of fluid 34, they essentially float on the fluid/fluid interface and are wet up from the bottom. As illustrated, all of the lateral surfaces of articles 38 and 40, including mating surfaces 42 and 44 and the remaining surfaces, are compatible selectively with fluid 36. Thus, fluid 36 wets all lateral surfaces of the components, creating menisci 50 at those surfaces. Since the free energy of the entire system favors minimization of the interface between fluids 34 and 36, free energy is minimized when the menisci contacting mating surfaces 42 and 44 are eliminated. Thus, when mating surfaces 42 and 44 are brought into contact, eliminating fluid 36 from the area between the mating surfaces, this state is energetically favored and the component articles are connected. The system functions most effectively when mating surfaces 42 and 44 are essentially perpendicular to the interface between fluids 34 and 36, but the mating surfaces need not be completely perpendicular to the interface. Preferably, mating surfaces 42 and 44 are canted by no more than about 10° relative to perpendicular with respect to the fluid interface.

Control of self-assembly such that mating of particular surfaces of particular components is favored over mating of other surfaces of other components can be achieved in a variety of ways, and one way is illustrated in FIG. 2. Where the mating surface of the article is maximized, that is, the height of the article is maximized, mating is preferred since a greater reduction in free energy of the system occurs upon elimination of a meniscus from that surface. For example, mating of articles 38 and 40 is most favored in the system of FIG. 2 since mating surfaces 42 and 44 together represent the greatest combined mating surface area. An intermediate interactive strength is represented by interaction of articles 52 and 54 having mating surfaces 56 and 58, respectively. Menisci eliminated by the mating of surfaces 56 and 58 does not define as great an area meniscus elimination as occurs when menisci are eliminated via mating of articles 38 and 40, thus the mating of articles 52 and 54 represents a decrease in overall free energy of the system, but not a decrease as great as that of mating of articles 38 and 40. An even less strong interaction is that between articles 60 and 62, including mating surfaces 64 and 66, respectively, representing the smallest overall mating surface area of the system.

The relative mating surface areas of the component articles, and resultant meniscus surface area eliminated via joinder of the articles can be controlled by adjusting the height or lateral dimension of one or more mating surfaces. Where it is desired to maximize mating between articles such as 38, 40, and 52, and to allow mating of articles such as 54, 60, and 62 to each other and to articles such as 38, 40, and 52 to a lesser extent, the mating surfaces of the articles can be sized as illustrated in FIG. 2. In this manner, articles 38, 40, and 52, if they include mating surfaces that facilitate attachment of each article to a variety of other articles, will form a conglomerate of similar articles with articles 54, 60, and 62 at the periphery of the conglomerate.

Articles 68 and 70 include mating surfaces 72 and 74, respectively, that are compatible with fluid 34 rather than fluid 36, and remaining surfaces 76 and 78, respectively, that are compatible with fluid 36. Thus, surfaces 72 and 74 are wet by fluid 34 and the remaining surfaces are wet by fluid 36. The free energy of the system is minimized when the meniscus at each of surfaces 72 and 74, defined by fluid 34 in contact with those surfaces, is eliminated. Articles 68 and 70 are illustrated as positioned in solution prior to close contact. In most situations, one of fluids 36 or 34 will wet a compatible surface of a self-assembling component to a much greater degree than will the other fluid wet the surface or surfaces of the component compatible with it.

Figure 3A:
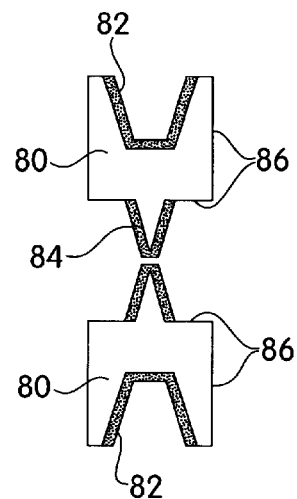
FIGS. 3a–3c schematically illustrate three configurations of self-assembling components, only one of which results in mating.
Figure 3B:
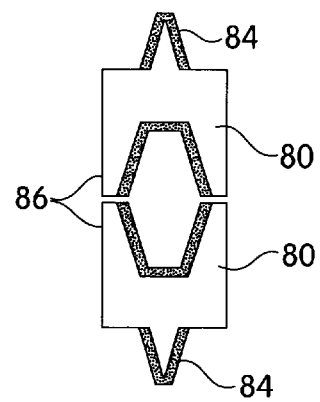
Figure 3C:
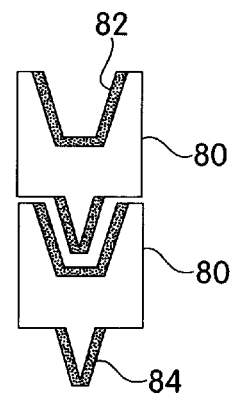

Referring now to FIGS. 3a–3c, component articles of a self-assembling system, including mating surfaces shaped, selectively, to facilitate selective mating of those surfaces only, are illustrated schematically in top view. In the embodiment illustrated, the component articles are identical to each other and therefore each article is referred to by numerical designation 80. Article 80 includes a first mating surface 82 defining a receptacle in a side of the article and a second mating surface 84 defining a protrusion in an opposite side of the article that matches the indentation of mating surface 82. Article 80, in particular the chemical functionality of mating surfaces 82 and 84 and remaining surfaces 86, and fluids used to achieve self-assembly are selected in one embodiment, such that mating surfaces 82 and 84 are highly wetted at a fluid/fluid interface as illustrated in FIG. 2, while remaining surfaces 86 form little or no menisci at the fluid/fluid interface. The total area of the mating surface interface, in connection with the fluids selected, is set such that when placed in a fluid/fluid interface as in FIG. 2 and agitated, the articles will fasten only when mating surface 82 and mating surface 84 interact. Thus, when two articles 80 interact such that respective mating surfaces 84 interact with each other, as illustrated in FIG. 3a, not enough meniscus is eliminated for the free energy of the system to be reduced to the extent that the articles remain fastened under self-assembly conditions. The arrangement of FIG. 3a can be formed but will always be re-broken. Similarly, interparticle contact via non-mating surfaces (remaining surfaces 86) will not reduce the free energy of the system to the extent that the particles will remain fastened under self-assembly conditions. Even if the remaining portion 86 of the highest surface areas of two articles are brought into contact with each other, the conditions of self-assembly will cause the particles to be separated. Only when mating surfaces 82 and 84 interact, as illustrated in FIG. 3c, is the free energy of the system reduced enough for the articles to remain fastened under self-assembly conditions. "Self-assembly conditions" is meant to define those conditions under which, when intended mating surfaces (those surfaces shaped or otherwise configured to provide mating) are in contact in good register, the components are not separated under the assembly conditions, but when the same surfaces are in contact but not in good register they either break free of contact or slide relative to each other until in good register, and where unintended mating surfaces are in contact, they do not remain in contact. Self-assembly conditions typically are those of agitation.

Referring to FIGS. 2 and 3 in combination, the self-assembly of component articles can be seen to be dependent upon minimization of the free energy of the fluid/fluid interface. The self-assembly thereby achieved can be fixed, or made permanent, via a number of techniques. According to one technique, the self-assembled components are adhered together by exposure to radiation that photocures a prepolymer at the interface of the mating surfaces. This can be achieved, for example, by providing a system in which the mating surfaces are hydrophobic and remaining surfaces hydrophilic, exposing the component articles to a hydrophobic prepolymer fluid to coat the mating surfaces with a thin film of the fluid selectively, and subsequent introduction of the component articles into the fluid system for self-assembly. The hydrophobic prepolymer fluid can in some cases facilitate better wetting of the mating surfaces by the hydrophobic fluid in the assembly system, and remains at the mating surface during the self-assembly process. Once self-assembly is achieved, the prepolymer is photopolymerized. In another system, a prepolymer that is selected to be pinned at the interface between fluids 34 and 36 is added to the system and, following self-assembly, the prepolymer is polymerized to form a film holding the self-assembled composite or composites in place. Removal of the film carries with it the self-assembled composites, and the composites can be fixed in another manner (for example adhered to a substrate) followed by optional removal of the "fixing" film. In another embodiment, a prepolymer is added to the fluid/fluid interface after self-assembly is complete. This can be carried out, where fluid 34 is water, by creating an emulsion of a prepolymer in water and adding the emulsion to the system. The emulsion will gravitate to the fluid/fluid interface, coating the interface, and can then be polymerized. A Norland optical adhesive is suitable for this purpose. Another technique for fixing the composites self-assembled at the fluid/fluid interface is to evaporate or otherwise remove the fluids, allowing the self-assembled composites to be deposited on a supporting surface.

In other embodiments, the self-assembled composite need not be fixed after self-assembly, but the mating surfaces adhere to each other strongly once they contact each other. This can be achieved by coating each of the matching mating surfaces with a chemical functionality that permanently affixes the mating surfaces to each other upon contact, for example, by coating matching mating surfaces each with one component of an interacting pair such as a biotin/avidin pair, complimentary DNA strands (see Mirkin, et al., above), or the like. In connection with components as illustrated in FIG. 3, this can be useful when one component is applied selectively to mating surface 84 and a different component is applied selectively to mating surfaces 82, and the component applied to mating surfaces 84 does not interact with itself. Thus, interaction occurs only when the protrusion defining mating surface 84 is fully inserted into the indentation defining mating surface 82, and any complication associated with firm attachment prior to complete mating does not occur. In another set of embodiments, discussed more fully below, it is preferred that the mating surfaces do not permanently bond to each other until a separate "fixing" step is carried out.

As mentioned above, self-assembly can take place in the absence of an external net force, in the presence of an external net force, or in the absence of any applied energy. For example, with reference to FIG. 2, where no energy is applied to the system components 68 and 70 will, over time, achieve close enough proximity that the menisci at their respective mating surfaces will be eliminated, minimizing free energy and fastening the articles. With application of random agitation, but not an external net force, the particles will more quickly come into random contact and will be joined at their mating surfaces. According to another set of embodiments, an external net force is applied to the system. In these embodiments the component articles can be magnetically aligned such that mating (as illustrated in FIG. 3c) will occur much more readily. Not only can the articles be aligned magnetically but magnetic or electrical fields can be used to bring component articles into proximity with each other where self-assembly can occur.

Figure 4:
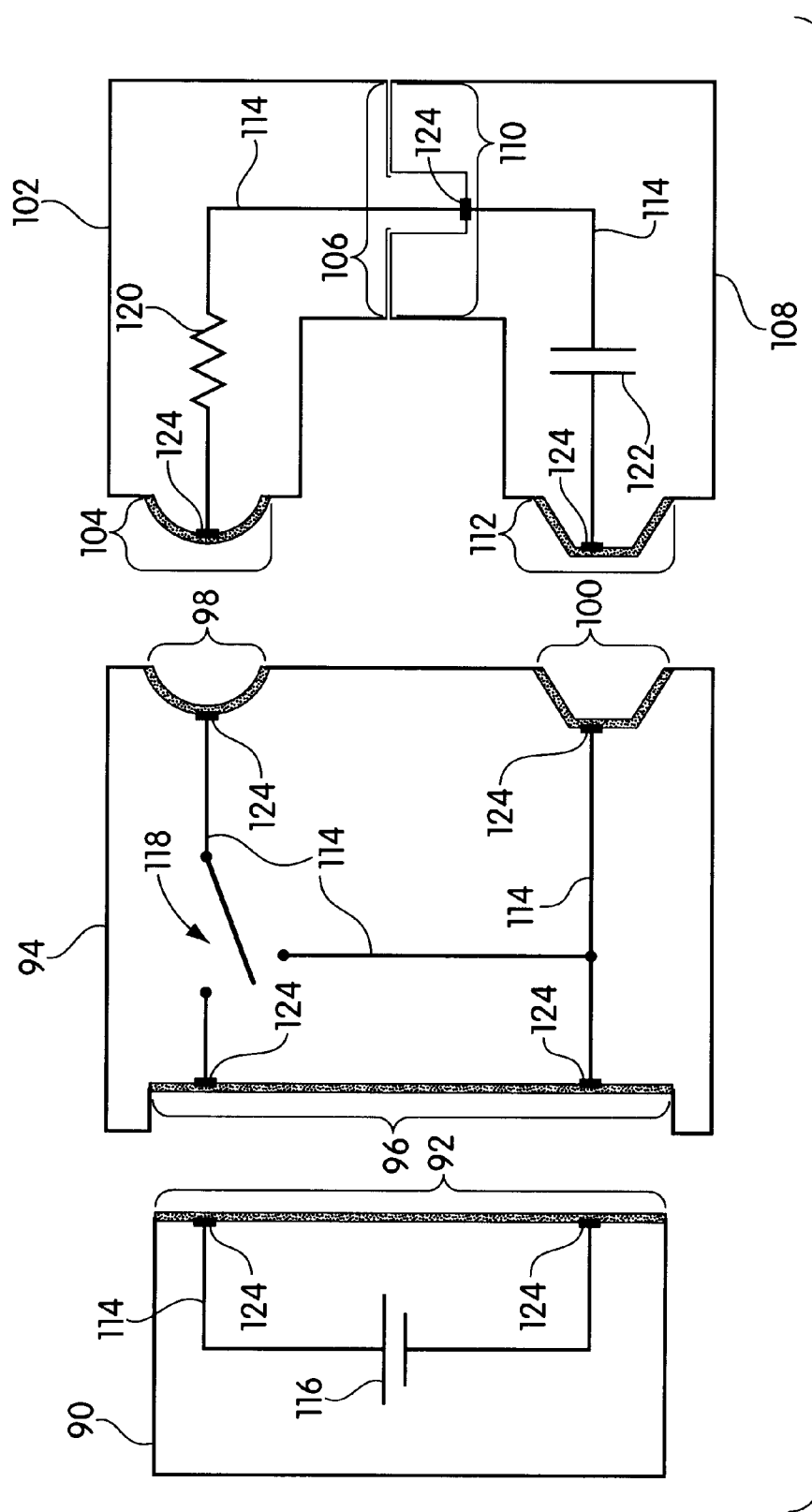
FIG. 4 is a schematic illustration of a self-assembling electrical circuit.

A variety of useful systems can be assembled using the self-assembly technique of the invention. One such system, with reference to FIG. 4, is an electrical circuit. The system of FIG. 4 is, when assembled, an RC circuit, and includes a first component article 90 having a mating surface 92, a second component 94 having a first mating surface 96 that matches mating surface 92, a second mating surface 98 and a third mating surface 100, a third component 102 having a first mating surface 104 that matches mating surface 98 and a second mating surface 106, and a fourth component 108 that has a first mating surface 110 that matches mating surface 106 and a second mating surface 112 that matches mating surface 100 of component 94. For purposes of illustration, components 102 and 108 are joined at their respective mating surfaces 106 and 110, but all other components are not connected. Each of the pairs of matching mating surfaces is shaped to facilitate selective mating and to prevent non-selective mating, that is, mating with an unintended (non-matching) mating surface. As illustrated, each of matching mating surfaces 92 and 96 is flat, each of matching surfaces 98 and 104 is semi-circular, mating surfaces 106 and 110 define a protrusion/indentation match, and each of mating surfaces 112 and 100 defines a half-hexagon. Thus, interaction of any of the mating surfaces with any other of the mating surfaces except the matching mating surface does not provide sufficient contact area between the non-matched mating surfaces for fastening of the surfaces to each other under self-assembly conditions. As in the embodiments described above, the mating surfaces of the system of FIG. 4 can be hydrophobic and remaining surfaces hydrophilic, with a hydrophobic prepolymer optionally applied to the mating surfaces (or applied to all surfaces, but remaining selectively at the remaining surfaces) prior to self-assembly, and self-assembly can be followed by photocuring or other fixing technique to permanently fasten the components as discussed above.

Each of components 90, 94, 102, and 108 includes at least one electrical conductor 114 that defines in part the electrical circuit. Component 90 include a voltage source 116, component 94 includes a switch 118, component 102 includes a resistor 120, and component 108 includes a capacitor 122. The particular electrical circuit is provided for purposes of illustration only, and any of a variety of electrical circuits could readily be assembled according to this embodiment. Power source 116 could be defined by two contact pads that could be addressed by two conductors from an external electrical power source. In the embodiment illustrated, each of the electrical conductors 114 terminates in a electric terminal 124 that is exposed at a mating surface and that is positioned such that when the mating surface mates with its matching mating surface of another component, the electric terminals 124 are in register and provide electrical communication between the component articles. The terminals could be positioned at other locations, of course, such that electrical contact is achieved when the mating surfaces mate.

FIG. 4 shows one example of an electrical circuit useful for an electrical function. "Useful for an electrical function" means useful, by those of ordinary skill in the art, for a function involving the application of electromotive force to a circuit to cause electrons to flow and to obtain a desired result.

Construction of electrical circuitry via the system illustrated in FIG. 4 can be useful where it is more economical to mass fabricate a plurality of electrical components contained in a particular component article, to separate the plurality of components, and to join the components as electrical circuits, rather than to mass fabricate a plurality of the microelectrical circuits.

Figure 5:
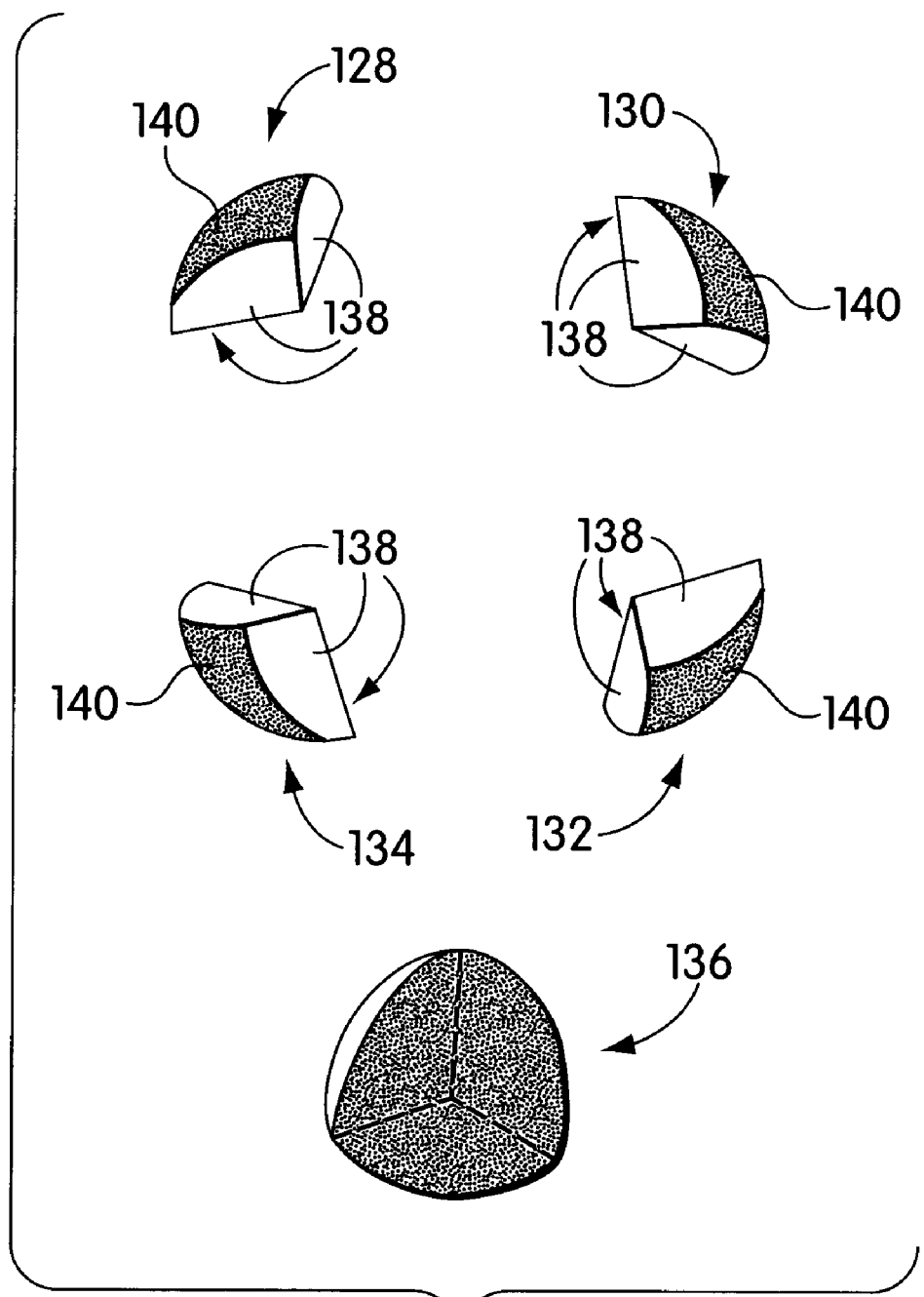
FIG. 5 is a schematic illustration of a three-dimensional self-assembling system.

Described thus far is an essentially two-dimensional self-assembly technique, that is, one in which component articles can mate with one or more other component articles, but in which mating takes place approximately in a plane. The invention also provides for three-dimensional self-assembly, as illustrated schematically in FIG. 5. As illustrated, four component articles 128, 130, 132, and 134 each define approximately one-fourth of a composite article 136 that can be self-assembled via the tetragonal assembly of components 128–134. Each of components 128–134 includes three essentially identical mating surfaces 138 (only two are shown in each component as illustrated), each of which matches any of the other mating surfaces 138, thus the components can be readily self-assembled into composite 136. Self-assembly of composite 136 from components 128–134 can be achieved by rendering mating surfaces 138 hydrophobic and the remaining surfaces 140 hydrophilic and allowing the components to self-assemble in an aqueous fluid such as water. Preferably, the components are first coated with a hydrophobic fluid which, when water is added, is displaced from the hydrophilic surfaces but not from hydrophobic surfaces. The hydrophobic fluid can act as a lubricant to facilitate self-correction in mating, can fill any voids or imperfections in the mating surfaces thus allowing complete hydrophilic solution exclusion from the interface of the mating surfaces (defect elimination), and is an adhesive that promotes adhesion of mating surfaces by, for example, being a prepolymer that can be photopolymerized after register is achieved, "fixing" the components. 3-dimensional assembly as illustrated in FIG. 5 can be useful for assembly of electrical circuits, and the like.

One feature of the present invention is that self-correction. That is, defect correction of mating in self-assembly is inherent. For example, with reference to FIG. 5, if two mating surfaces 138 come into contact with each other, but are not in register with each other (that is, they do not contact each other fully over their entire mating surfaces 138), the components can shift relative to each other until registration is achieved. The system can also be self-correcting in that if the mating surfaces come into contact with each other to a very small extent, that is, very little surface area of either mating surface contacts the other mating surface, the components may separate and eventually the respective mating surfaces may contact the same or different mating surfaces in better register.

In embodiments of the invention in which the mating surfaces are hydrophobic and self-assembly is promoted by agitation of components in a hydrophilic solution, the free energy of the system is minimized by minimizing hydrophilic fluid/hydrophobic surface interactions, thus accurate register of mating surfaces with each other is promoted. This self-correction can be facilitated by addition of a hydrophobic fluid, as mentioned above, which selectively coats and forms a film on the hydrophobic mating surfaces.

Although self-assembly in hydrophilic fluid of components having hydrophobic mating surfaces is discussed primarily, the opposite can be carried out. That is, the components can have mating surfaces that are hydrophilic and remaining surfaces that are hydrophobic, the self-assembly process taking place in hydrophobic fluid. In either case, the fluid in which the self-assembly is promoted should not wet the mating surfaces. Preferably, the contact angle of the self-assembling fluid on mating surfaces will be at least 60°.

Figure 6:
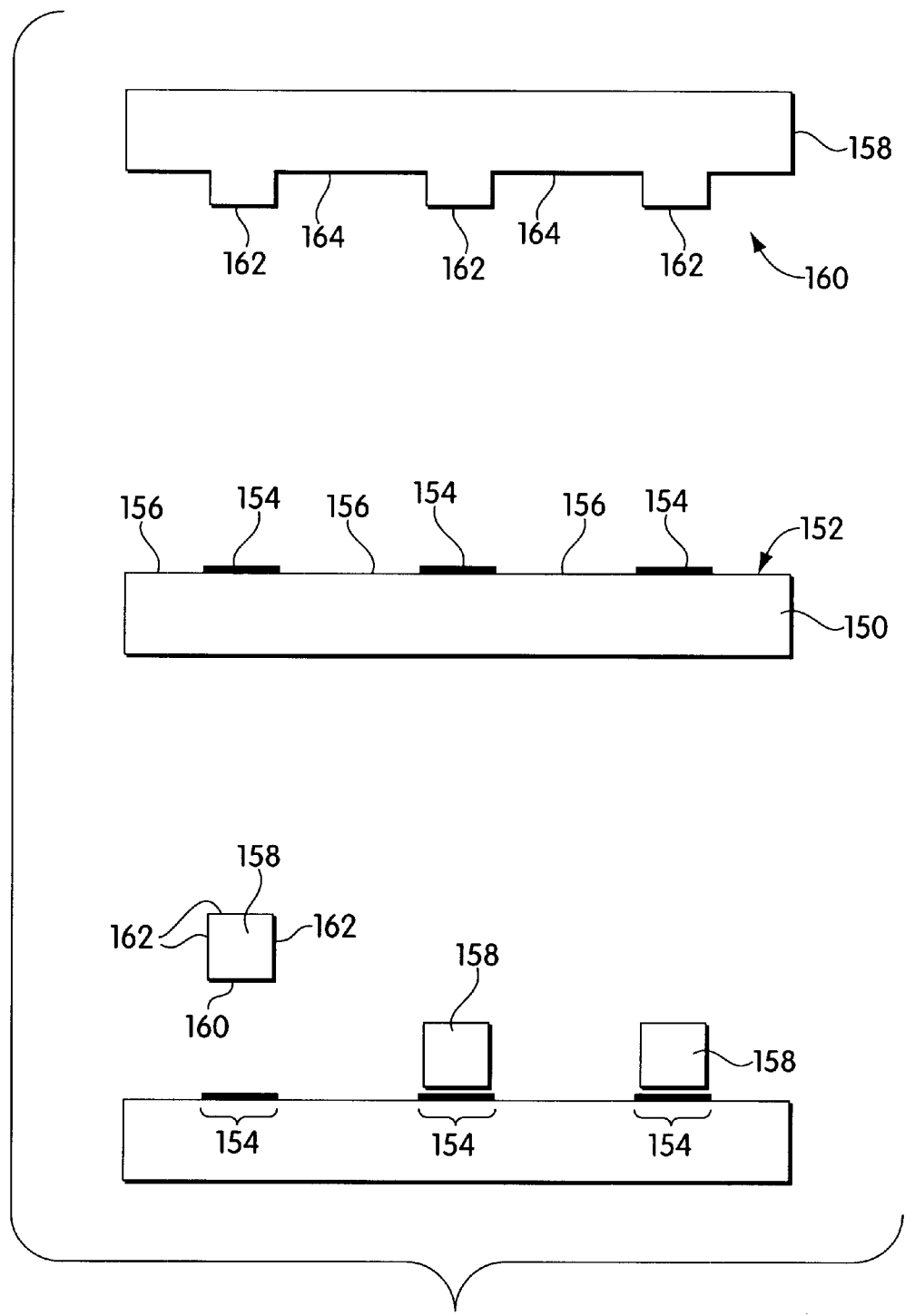
FIG. 6 is a schematic illustration of self-assembly at a surface.

Referring now to FIG. 6, a technique of the invention is illustrated that allows for precise placement of articles at a surface, in proper register, via self-assembly. In the technique, a substrate 150 has a surface 152 upon which components desirably are precisely positioned. For example, substrate 150 could be a semiconductor upon which are positioned components of a microelectrical circuit. The technique involves modification of surface 152 to include regions of a first chemical functionality 154 and regions of a second, different chemical functionality 156. These regions can be created, for example, via microcontact printing as described in U.S. Pat. No. 5,512,131, referenced above, in which an elastomeric stamp or applicator 158, including a contoured surface 160 having a plurality of protrusions 162 and intervening indentations 164, is coated with a self-assembled monolayer-forming species and brought into contact with surface 152. When stamp 158 is removed from surface 152, a self-assembled monolayer is formed selectively at regions 154 that had been contacted by (in register with) protrusions 162, while intervening regions 156 in register with indentations 164 remain free of the self-assembled monolayer. As is known, a self-assembled monolayer of this type can be formed in which the exposed chemical functionality (the chemical functionality of the self-assembled monolayer-forming species facing away from the surface 152) can be tailored as desired. For example, surface 152 can be defined by a thin film of gold and a self-assembled monolayer can be formed at regions 154 defined by a plurality of molecules each including a thiol at one end (which adheres to gold) and a hydrophobic functionality at the opposite end (the characteristic of the resultant exposed surface region at the self-assembled monolayer after monolayer formation). Intervening regions 156 can be filled in by applying a self-assembled monolayer-forming species to the surface defined by a thiol terminating in a hydrophilic functionality, thus intervening regions 156 are rendered hydrophilic. A hydrophobic fluid (optionally adhesive) as described above can first be used to coat the component articles, or the surface, and then can serve to fix the articles to the surface. This technique for patterning surface 152 is but one embodiment of the invention. A variety of other techniques, including photolithography, can be used.

Subsequently, a plurality of self-assembling component articles 158 can be applied to the surface by rendering one surface 160 of each article hydrophobic, and the remaining surfaces 162 hydrophilic, positioning each article 158 in proximity of an appropriate region 154 of surface 152, where a thin film of water coats surface 152, and gently agitating the system until articles 158 are self-assembled in precise register with regions 154 due to free energy minimization.

Any of a variety of materials can be used to fabricate self-assembling components in the invention. The components can be fabricated from polymers, ceramics, glasses, and the like, and can be altered in terms of density, as described above, for self-assembly. Component articles can be made of the same material, or can be made of different materials so long as the surface chemical functionality criteria are met. One situation in which it could be advantageous to use different materials is in connection with the electrical circuit of FIG. 4, in which it may be easier to fabricate power source 116 in a first component-forming material, switch 118 in a second material, resister 120 in a third material, and capacitor 122 in a fourth material. The material used for the self-assembling components should not dissolve or swell unacceptably in a liquid used in the self-assembly process in which it would be brought into contact for substantial periods of time.

The component articles of the present invention can be of a variety of sizes according to various embodiments. In one embodiment of a general two-dimensional assembly technique, the component articles are from about 150 nm to about 2 mm height, and are of width typically on the order of from about 1 to about 5 times the height. Preferably, the height of the component is from about 400 nm to about 1 mm, more preferably from about 1 µm to about 1 mm in height. In another set of embodiments, especially in connection with three-dimensional assembly, component articles are less than about 1 mm in cross-section at at least one location, preferably less than about 500 mm in cross-section, and in another set of embodiments are from about 25 nm to about 500 mm in cross-section at at least one location, preferably from about 10 microns to about 300 microns, and more preferably from about 50 microns to about 200 microns in cross section. The articles each have a maximum dimension, defined by the cross section of the article at maximum cross section.

Chemical modification of selected surfaces of the self-assembling component articles can be carried out by blocking non-selected surfaces and exposing selected surfaces to plasma, as discussed, by formation of a self-assembled monolayer or other chemically modifying species on selected portions, optionally by first depositing a metal layer. The self-assembled monolayer can terminate in hydrophobic, hydrophilic, or other functionality or can subsequently selectively bind a chemical or biochemical species having desired functionality. Suitable functional groups include polyoxyalkylene, polyalkene, carboxylic acid, acid chlorides, and anhydrides, hydroxyl groups, amino acid groups, or the like. Self-assembled monolayers, and methods for preparing self-assembled monolayers on surfaces, are described in U.S. Pat. No. 5,512,131, referenced above.

While the examples below demonstrate self-assembly with components on the order of 1–10 mm, the size of the component articles can be at least as small as minimum dimensions given above, and be assembled by the action of fluid in an energy-minimizing procedure, as demonstrated by calculation of the change in interfacial free energy as two perpendicular surfaces move from infinite separation to some finite separation, d. The height, h(m), of the $C_{10}F_{18}/H_2O$ interface between the two objects was calculated using the linearized Laplace equation, below.

$$\frac{\partial^2 h}{\partial x^2} = \frac{1}{\gamma}(\Delta \rho g h - \Delta P_0)$$

In the above equation, $\gamma$(J m$^{-2}$) is the interfacial free energy, $\Delta \rho$ (kg m$^{-3}$) is the difference in density between the two fluids, the zero for h(m) is set at the $C_{10}F_{18}/H_2O$ interface far from the objects, g(m s$^{-2}$) is the acceleration due to gravity, and $\Delta P_0$ (Pa) is defined as the change in pressure across the interface at x=0; if we assign a value of h(0)=0, then the value of $\Delta P_0$ does not enter into the solution. Using the boundary conditions, h(r)=t, where t(m) is the thickness of the object, and $(\partial h/\partial x)_{x=0}$=0, the solution of the above equation is the equation below.

$$h(x) = t\left[\frac{2}{1 - e^{(d/x_c)}} + \frac{e^{(-x/x_c)} + e^{(x/x_c)}}{e^{(d/2x_c)} - e^{(-d/2x_c)}}\right]$$

In the equation immediately above, we have made the replacement $x_c=(\gamma/\Delta p)^{1/2}$; when d is infinite, the capillary surface is given by a simple exponential decay with h(x)∞e$^{(-x/x_c)}$. To estimate the change in interfacial energy as a function of distance, we calculated the difference in the arc length. $\Delta l$ (m), defined by h(x) for two surfaces separated by d and two surfaces separated by an infinite distance; the change in arc length was then multiplied by the width of the object, w(m), and the interfacial free energy to yield the change in interfacial free energy (13). As a model system, we assigned a length to the perpendicular surface equal to five times the height. This model gave a change in interfacial free energy, $\Delta W$, defined in the equation below.

$$\Delta W = 5\Delta l \gamma t$$

The change in interfacial free energy divided by thermal energy, kT, was plotted as a function of separation, d, for heights from t=1 mm to 100 nm. From this plot, it was concluded that the energetics for self-assembly are favorable for objects with t as small as 100 nanometers. When spheres are used for the two-dimensional self-assembly the radius at which $\Delta W/kT \sim 1$ has been calculated to be on the order of 1–10 $\mu$m. Self-assembly driven by capillary forces between conformal surfaces should therefore enable the assembly of much smaller objects than would be possible with spheres; the ability to control the shapes and interfacial properties of these objects makes it possible to design the geometries of the resulting arrays.

Four factors contribute to the success of this strategy for the directed self-assembly of small objects. First, the aggregates are energetically more stable than the individual dissociated objects or disordered aggregates. Second, formation of the aggregates is reversible when the system is agitated: formation and dissociation of the aggregates compete. The aggregates are then able to reach the energetically most stable form. Third, the hydrophobic sides are attracted to one another over large distances (about 2–3 times the dimension of the height): assembly is relative rapid. Fourth, even when two hydrophobic sides are in close proximity, they can move laterally from side to side, lubricated by the intervening film of $C_{10}F_{18}$, and can maximize the amount of hydrophobic area in contact.

The aggregates formed here demonstrate a strategy for using self-assembly to make ordered arrays of small objects. Computations show that this strategy can be extended to $\mu$m-scale objects, and that it provides an approach to the assembly of objects at this scale. This approach is useful in the assembly of certain types of microelectronic and optical systems, microelectromechanical systems (MEMS), and displays.

The function and advantage of these and other embodiments of the present invention will be more fully understood from the examples below. The following examples are intended to illustrate the benefits of the present invention, but do not exemplify the full scope of the invention.

EXAMPLE 1

Figure 7A:
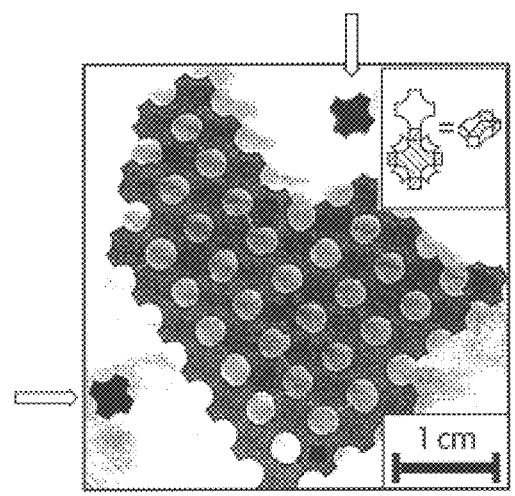
FIGS. 7a–7c are photocopies of photographs of two-dimensional self-assembled systems.
Figure 7B:
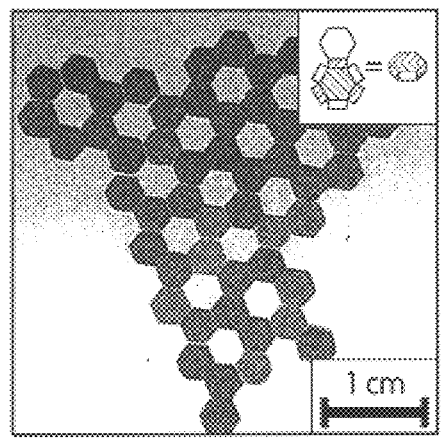
Figure 7C:
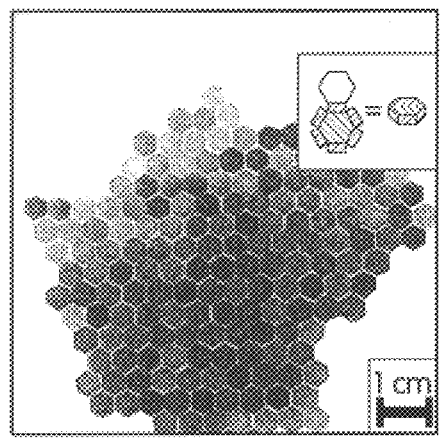

Two-Dimensional Self-Assembly of Composites from Polymeric Component Articles Via Selective Mating Surface Interaction FIGS. 7a–7c are photocopies of photographs of self-assembled composites, formed of centimeter-scale component crosses and hexagons via surface-selective mating. The polymeric component articles were made of polydimethylsiloxane (PDMS), a hydrophobic polymer with a surface free energy equal to 22–24 ergs/cm$^2$, and were made by curing the articles in a mold of desired shape. Selected surfaces were made hydrophilic by oxidation with an oxygen plasma (Owen, *Coatings Technol.* 53, 49 (1981)); surfaces that were to be hydrophobic were either covered with tape prior to the oxidation, or generated by cutting the PDMS after oxidation to expose a fresh hydrophobic surface. In each case the lower face of each article was rendered hydrophobic, the upper surface rendered hydrophilic, and the side surfaces rendered selectively hydrophilic or hydrophobic (as illustrated in the insets, hashed surfaces represent hydrophobic surfaces, and clear surfaces represent hydrophilic surfaces). The component articles were positioned in a two-phase system of $C_{10}F_{18}$ and water, and migrated to the fluid/fluid interface, with the lower, hydrophobic base in contact with the $C_{10}F_{18}$ and the upper-hydrophilic face in contact water. The $C_{10}F_{18}$ wetted the hydrophobic sides and formed menisci; the hydrophilic sides barely perturbed the $C_{10}F_{18}/H_2O$ interface. That is, $C_{10}F_{18}$ wetted the unoxidized PDMS and formed a meniscus and the water wet the higher energy surface of oxidized PDMS. The capillary forces acting at the oxidized surfaces were very weakly attractive compared to those of hydrophobic surfaces, because the PDMS (density equals 1.05 g/ml) does not sink far enough into the $C_{10}F_{18}$ (density equals 1.91 g/ml) to generate a meniscus with significant curvature at the hydrophilic interfaces. Other fluorinated alkanes with properties similar to $C_{10}F_{18}$ were used with equal success. The system was placed on a rotary shaker that oscillated gently in the plane of the interface. Self-assembly conditions were set by adjusting the frequency of rotation for each system to allow in-plane movement of the liquid to bring the objects close to one another and to break up misformed aggregates that is, under self-assembly conditions, where mating surfaces interacted the surfaces maintained contact, but where non-mating surfaces were brought into contact, the contact was short-lived. A typical frequency was 1–2 Hz. When two hydrophobic sides of the PDMS component articles came within a critical distance from one another (approximately 5 mm) they moved into contact. This movement was driven by the minimization of the interfacial free energy of the system caused by eliminating the curved menisci at the hydrophobic surfaces. A thin layer of $C_{10}F_{18}$ remained between the component articles even at their closest contact. The evidence of the remainder of a thin layer of $C_{10}F_{18}$ was indirect: when two flat pieces of PDMS came in contact in water with no $C_{10}F_{18}$ present, they stuck to each other strongly and effectively irreversibly. When $C_{10}F_{18}$ was added to the water after the PDMS solids came into contact, they remained stuck to one another. Self-assembly required approximately 5–30 minutes for completion. The result was the formation (FIG. 7a) of an extended two-dimensional square array formed from crosses having hydrophobic ends. The contrast between the assemblies of FIGS. 7b and 7c demonstrates the level of control that can be achieved. In the arrangement of FIG. 7b, alternate sides of the hexagons were made hydrophobic, and the objects formed an open network. In the arrangement of FIG. 7c all sides of the hexagons were hydrophobic, and the objects formed a close-packed array.

EXAMPLE 2

Figure 8A:
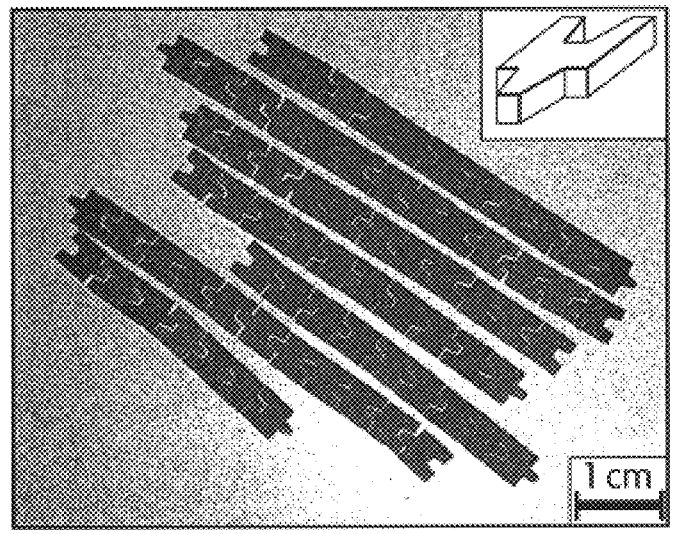
FIGS. 8a–8b are photocopies of photographs of two-dimensional self-assembled systems.

Self-Assembly of Component Articles Having Mating Surfaces Shaped for Selective Matching This example makes use of shape-selective self-assembly. Component articles were made of PDMS and a $C_{10}F_{18}/H_2O$ system was used, as described above. In a first experiment the component articles were shaped as illustrated in FIG. 3 where articles 80 each included hydrophobic mating surfaces 82 and 84 and hydrophilic remaining surfaces 86. During self-assembly, the amplitude of oscillation of the system was set to be large enough to break apart pairs interacting head-to-head or tail-to-tail (FIGS. 3b, 3a) but to leave together those interacting in head-to-tail mating of the mating surfaces 82 and 84 as illustrated in FIG. 3c. Head-to-tail mating interaction as in FIG. 3c is energetically favorable because it maximizes the area of hydrophobic surface in close proximity. The structure is also kinetically stable to disassociation caused by stirring, since the oscillating motion at the surface; a motion that seems to influence the objects primarily by shear; has minimal influence on pairs of objects once assembled into a matching, mating, head-to-tail configuration. The components were on the centimeter scale and a photocopy of a micrograph of self-assembled composites formed according to this technique is shown in FIG. 8a.

Figure 8B:
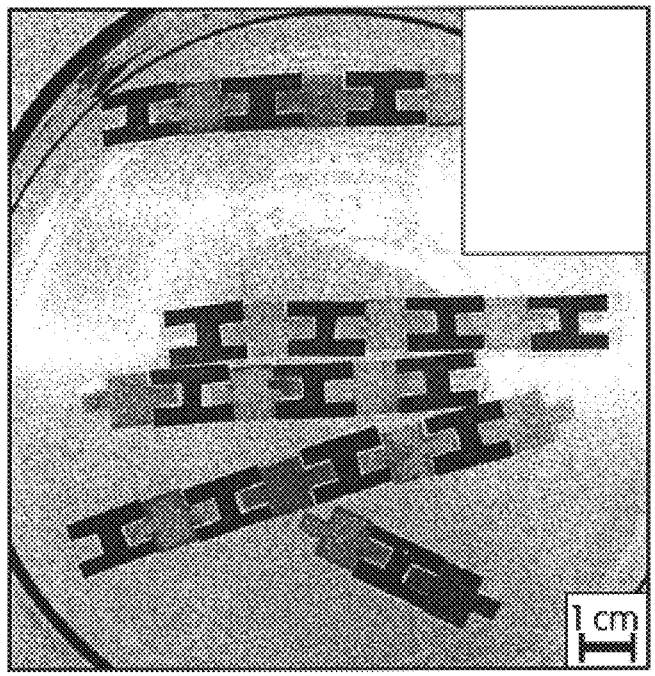

A similar system in which the component articles included either two indentations or two protrusions was self-assembled and the resultant self-assembled composites are shown in FIG. 8b, which is a photocopy of a photograph. The components were, again, on the centimeter scale.

EXAMPLE 3

Mating-Surface-Area Selective Matching of Self-Assembling Components

The area of hydrophobic side mating surfaces of self-assembling component articles as illustrated in FIG. 2 was used to direct the self-assembly of various objects. A system as illustrated in FIG. 3 was provided, using square component articles having hydrophilic top surface and hydrophobic bottom and side surfaces. A mixture of two sizes of articles, each with square bases of dimension on the order of 0.4 cm on a side, but with heights that differ by a factor of 5 were agitated at the interface between $C_{10}F_{18}$ and water. The order of attractive forces was as illustrated in FIG. 2. The degree of agitation was set to allow the tall objects to form an array but to prevent tall objects from forming arrays with short objects and from short objects forming arrays with each other. When agitation was stopped, the short subjects coagulated around the array of large objects.

EXAMPLE 4

Three-Dimensional Self-Assembly

Self-assembly was used to form structured three-dimensional aggregates of mm-scale components. The basis for self-assembly involved recognition of shapes and minimization of free energy of liquid-liquid interfaces.

Figure 9:
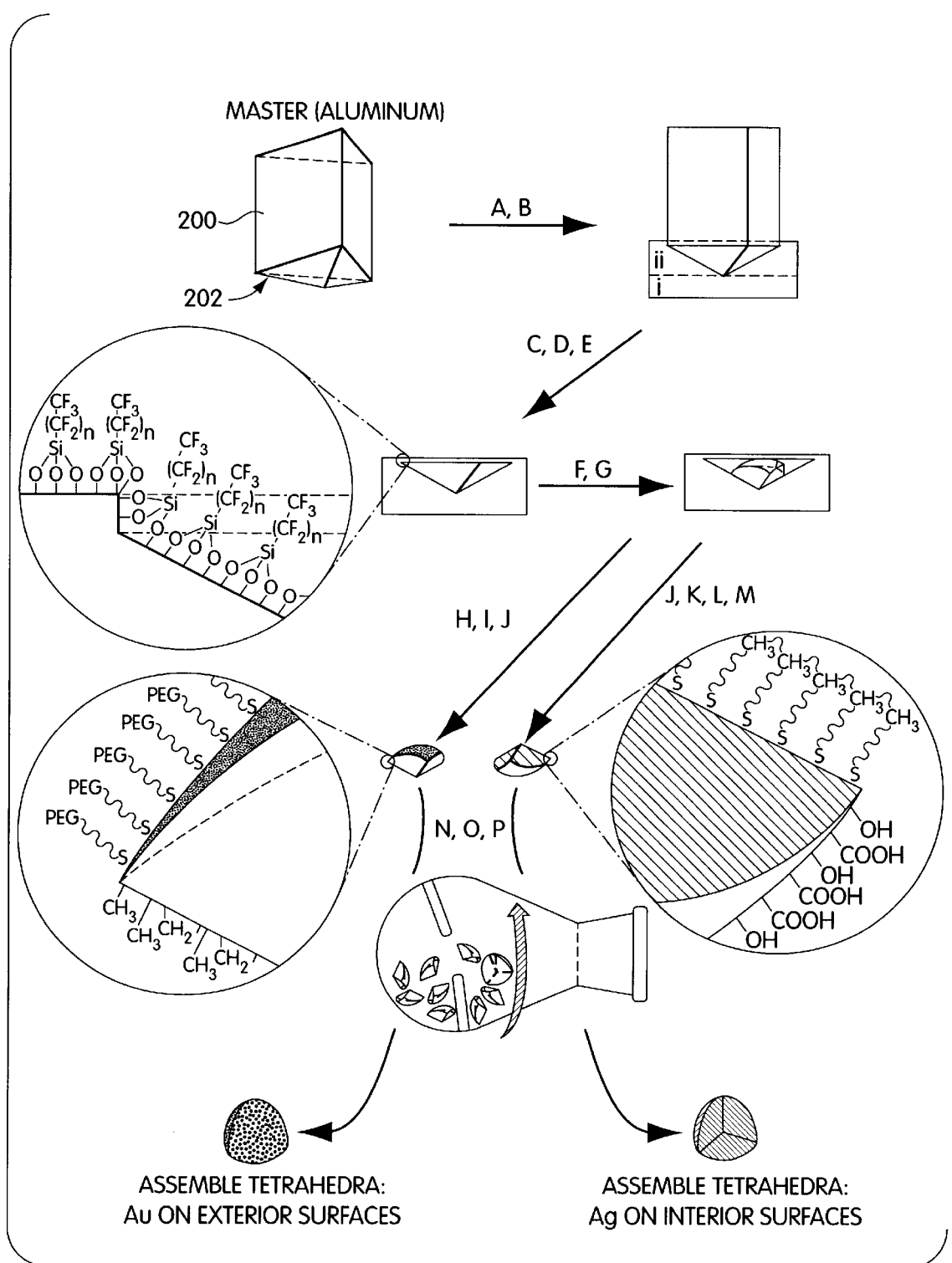
FIG. 9 schematically illustrates a process for three-dimensional self-assembly.
Figure 10A:
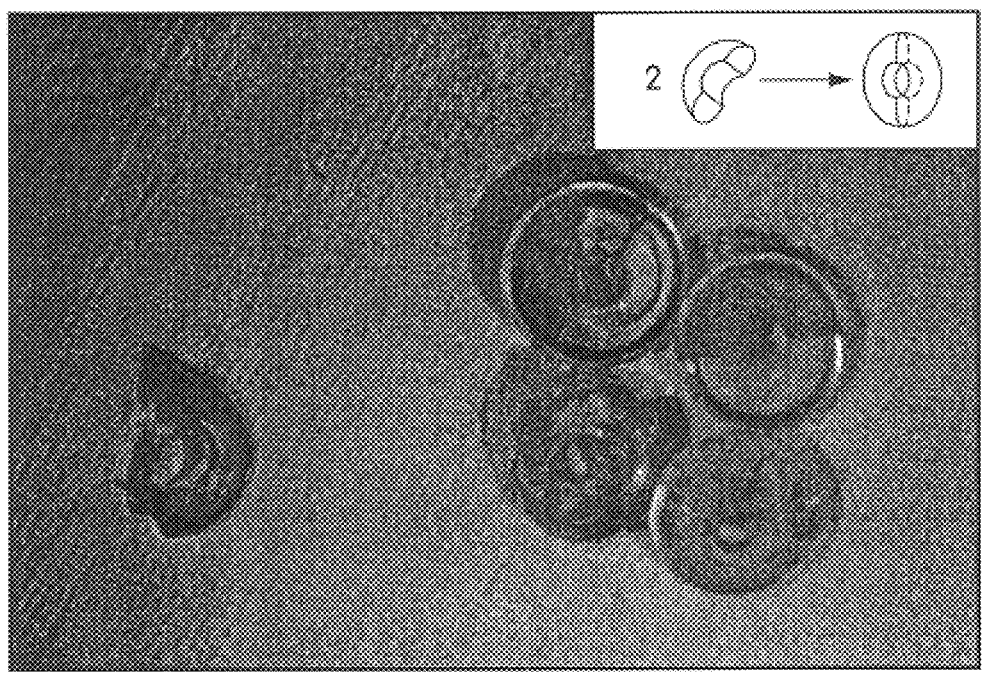
FIGS. 10a–10d are photocopies of photographs of three-dimensional self-assembled articles.
Figure 10B:
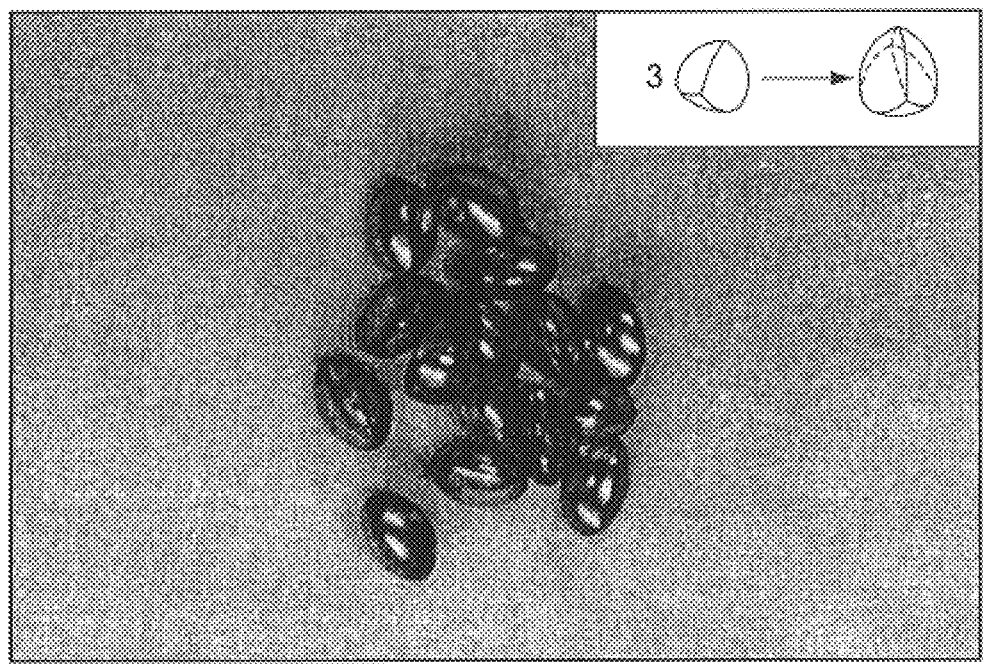
Figure 10C:
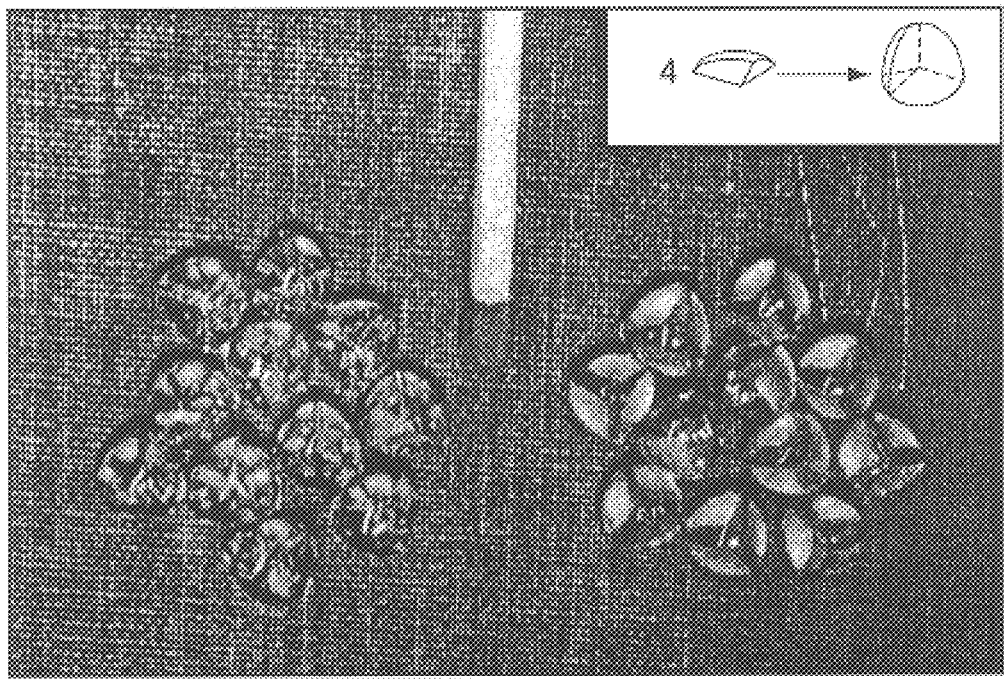
Figure 10D:
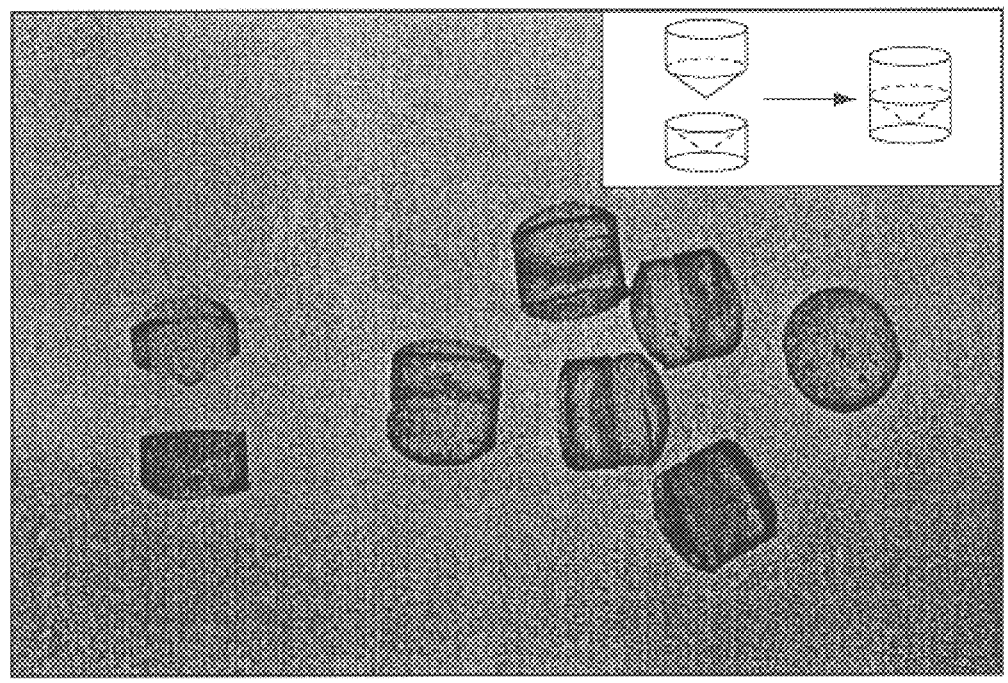

The surfaces of the self-assembling components were patterned into hydrophilic and hydrophobic regions via two procedures. In one procedure, selected portions of the surface were covered and exposed surfaces were oxidized with oxygen plasma, rendering the covered surfaces hydrophobic and the exposed surfaces hydrophilic. In a second procedure, selected regions were coated with a metal, by evaporating the metal onto the surface, and assembling monolayers of hydrophobic or hydrophilic thiols were created on the metal surfaces. The components were placed in a flask, their surfaces wetted with ethanol, a small amount (0.05–0.1 $\mu$l/mm$^2$ of hydrophobic surface) of a hydrophobic liquid—either an alkane or a photopolymerizable adhesive, such as dodecyl methacrylate—was added, and the system was stirred gently to coat the surfaces. Water was added, which displaced the hydrophobic liquid from the hydrophilic surfaces, while leaving a thin film of hydrophobic liquid coating the hydrophobic surfaces. The aqueous suspension of components was tumbled in a rotating flask. Agitation brought the components into contact: the hydrophilic surfaces stuck neither to other hydrophilic surfaces nor to the hydrophobic surfaces with their thin coating of hydrophobic liquid; the hydrophobic surfaces adhered to one another. Once the surfaces were in contact, the liquid acted as a lubricant, and allowed the components to self-correct; to adjust their position relative to one another by lateral movement. This movement minimized the interfacial free energy of the system by minimizing the surface area of the lubricant/water interface. After the systems had approached equilibrium, UV irradiation (when the liquid was a photopolymerizable adhesive) froze the assembly into permanent form. FIG. 9 is a schematic outline of the process. A master 200 was machined from aluminum so as to include a surface 202 defining a portion of a tetrahedron including three sides meeting at edges defining angles of 109°. Process steps: A) A pad of PDMS (I) was cast and cured. B) The master was cast into a second layer (ii) of PDMS. C) After curing, the master was removed. D) This PDMS mold was oxidized in an oxygen plasma to generate surface Si—OH groups. E) Exposure to perfluoroalkyl trichlorosilane vapors resulted in the formation of a perfluoroalkylated surface (see insert). F) A measured amount of liquid polyurethane prepolymer was added by means of a syringe pump and G) was cured in UV light. H) Gold was evaporated on top of the parts while they remained in the mold. I) A hydrophilic SAM was formed on the gold surface by immersion in a solution of a thiol terminating in polyethylenglycol (PEG) groups (the PEG used was methoxy-terminated material with MW$\approx$350); this thiolate is hydrophilic and resists adhesion. J) The parts were removed from the mold. K) Silver was evaporated on the bottom of the parts. L) The parts were oxidized in an oxygen plasma. M) A hydrophobic SAM was generated on the Ag surface by immersion of the parts in a solution of $CH_3(CH_2)_{15}SH$. N) A number of parts (typically 20–100) were placed in the assembly flask and the liquid adhesive and ethanol were added and distributed. O) Water was added until the flask was completely filled, and the mixture was rotated mechanically for several hours; the tetrahedra assembled themselves. P) If the liquid adhesive was photocurable, the parts froze into place upon UV irradiation. Photocopies of photographs are provided in FIGS. 10a–d, showing several examples of self-assembled structures formed according to this technique. The scale bars in the pictures represent a length of 1 cm. A) Two arches (one of them at the left) form small 'donuts'. The differentiation was achieved in this case by oxidation of the outer sides, while the adhering surfaces were unmodified, hydrophobic polymer (NOA-63). B) Small 'footballs' formed from three identical parts. The adhesive sides were unmodified polymer (NOA-63) and the curved outer surface was a 20 nm thick layer of gold (with an underlying layer of 2 nm of titanium as adhesion promoter) covered with a self-assembling monolayer (SAM) of a hydrophilic, adhesion-resistant polyethylene glycol-terminated thiol. C) Tetrahedron-like structures formed by self-assembly of four identical parts. The surface treatment for the objects on the left was as in B (gold on the exterior faces, see also Scheme I). On the right, the adhesive, interior sides of the tetrahedra were covered with a hydrophobic SAM ($CH_3(CH_2)_{15}SH$) on silver, while the outer sides were plasma-oxidized polymer. This configuration made it possible to visualize the interior surfaces. D) Two different parts assembled in a lock-and-key manner. As in FIG. 1, the inner part is unmodified polymer, while the outer part was made hydrophilic by treatment with an oxygen plasma.

EXAMPLE 5

Self-Assembly of RC Electric Circuit

Figure 11:
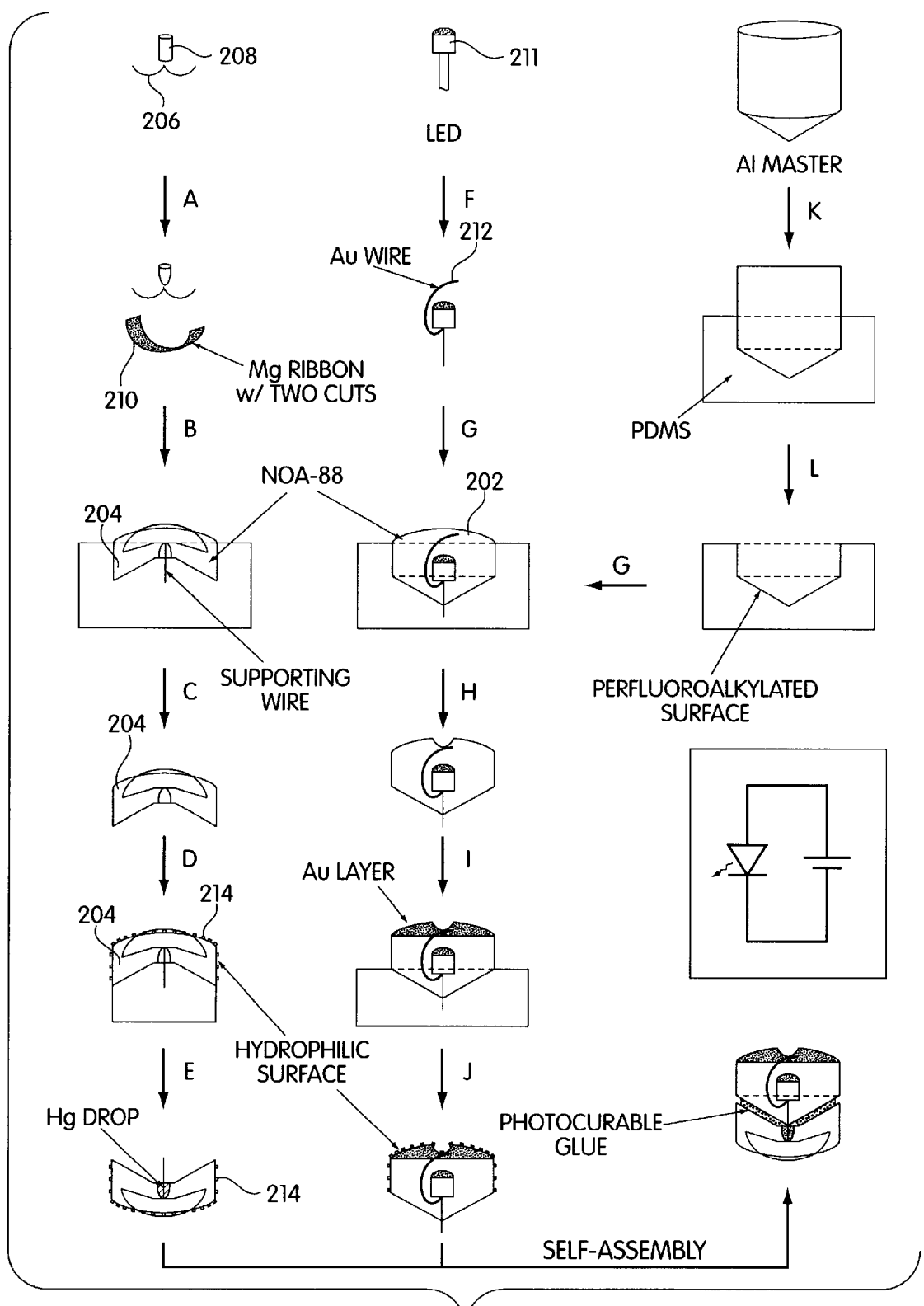
FIG. 11 is a schematic illustration of a process for self-assembling a three-dimensional electrical circuit.

Self-assembly of components from a suspension in water was used to join two subunits into an operating electrochemical system comprising an electrical circuit, a LED, and a battery, as illustrated in FIG. 11. The mutual recognition of the subunits was based on hydrophobic surfaces with complementary shapes. One subunit contained the LED and a gold electrode; the second consisted of a mechanically compliant electrical connector and a magnesium electrode. After self-assembly, the completed devices were placed in an aqueous solution of $[Fe(CN)_6]^{3-}$ and contact of the external electrodes with the oxidizing electrolyte solution completed the electrical circuit, generating power by the dissolution of the magnesium anode, and illuminated the LED.

The miniature LED (Lumex Inc., Part #SSL-LX203CSRT) used in this circuit turned on at about 1.5 V, and had a nominal operating voltage of 1.6 V. In order for the electrochemical element to exceed this potential under load, an oxidizing electrolyte (potassium ferricyanide, $K_3[Fe(CN)_6]$, 60 mM) was used in conjunction with the gold-magnesium element. The electrolyte also contained disodium ethylenediamine tetraacetate (EDTA, 60 mM)—a complexing reagent for magnesium ions—and acetic acid (added to achieve pH 4) to reduce the internal resistance of the electrochemical cell. The overall reaction powering the LED involved dissolution of the magnesium(0) at the anode and reduction of ferricyanide to ferrocyanide at the gold cathode; side reaction was the formation of $H_2$ at the magnesium surface. The pH was chosen as a compromise between minimizing electrical resistance and minimizing the evolution of $H_2$. Initial experiments showed that the maximum attainable current was approximately proportional to the surface area of the gold electrode and was not limited significantly by the surface area of the magnesium. The area of the gold electrode was therefore maximized by evaporation of gold (100 nm, with 5 nm of titanium as an adhesion promoter) over the entire top surface of the "key" unit. To ensure good electrical contact between this layer and the gold wire at the anode of the LED, the thickness of the gold film was increased to 1 $\mu$m by electroplating using a commercial bath (Orotemp 24 from Technic, Providence, R.I.).

Both subunits 202 and 204 were fabricated from NOA-88 (Norland, New Brunswick, N.J.), a stiff, photocurable polyurethane with excellent adhesion to the metals used. To build the "lock" part 204, the center of a short molybdenum wire 206 (0.13 mm diam.) was crimped into a copper cup 208 (made by closing one side of a 1.6 mm diam. copper tube) and then connected to the ends of a bent magnesium ribbon 210 before casting with the polyurethane-prepolymer in a mold made of PDMS. After curing the polymer with UV light, the copper cup was treated with a drop of concentrated aqueous $Hg(NO_3)_2$ solution to pre-form a thin layer of copper amalgam on its surface. After amalgamation, the cup was washed with water and absolute ethanol, dried, and filled with mercury (~2 $\mu$l) by using a syringe. Capillary forces held the drop in the cup, while the molybdenum wire prevented the mercury from creeping into the magnesium (amalgamation reduced the maximum attainable electrochemical potential).

The "key"-part 202 was fabricated by bending the anode of the LED 211 up and replacing the last few mm by a piece of gold wire 212. This construction was cast in the polymer to a thickness that just covered the gold wire. After curing, some polymer was removed to re-expose the gold wire, leaving the exposed part recessed from the rest of the surface. This design protected the mechanically sensitive area in which the wire came into contact with the upper gold layer from damage during self-assembly, a process that produced some mechanical stress as a result of tumbling. The extended gold layer was then formed by evaporation and electroplating as described above.

Before self-assembly, the exposed surfaces of both "lock" 202 and "key" 204 elements were differentiated into the hydrophilic and hydrophobic regions. The surfaces that were designed to interact (the hydrophobic surfaces) were protected physically by putting them into molds with complementary shapes and exposing then to an oxygen plasma. This exposure rendered the exposed surfaces hydrophilic. The "key"-parts were also immersed for several minutes in an ethanolic solution of $HS(CH_2)_{11}(OCH_2CH_2)_nOH$ (n~72); this procedure formed a hydrophilic SAM 214 on the exposed gold surface. An equal number (~8) of the "lock"- and "key"-parts were then suspended in water in presence of a small amount of photocurable lubricant. When the mixture was gently agitated by tumbling, the "lock"- and "key"-elements assembled. Subsequent irradiation with UV light froze the parts in place. This self-assembly usually yielded correctly assembled pairs quantitatively. When these assembled circuits were transferred to the ferricyanide electrolyte solution, the gold-magnesium element provided the LED with enough power to light.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method of self-assembly comprising:
   providing a first component article having a maximum dimension, a total surface area, and a first mating surface and a second component article having a maximum dimension, a total surface area, and a second mating surface that matches the first mating surface, the first and second mating surfaces each defining an area equal to at least one percent of the lesser of the total surface areas of the first and second component articles, the first and second component articles separated by a distance at least equal to 1/100 of the maximum dimension of the first or second component article;
   chemically modifying the first and second mating surfaces such that the chemical modification provides better wetting of the mating surfaces; and
   without applying a net external force to either of the first and second component articles, and under set conditions, allowing the first mating surface to fasten to the second mating surface irreversibly under the set conditions thereby forming a composite article of the first and second component articles.

2. A method as in claim 1, further comprising providing a third component article having a maximum dimension, a total surface area, and a third mating surface that matches a mating surface of the second component, and without applying a net external force to either of the second and third component articles, and under set conditions, allowing the third mating surface to fasten to the mating surface of the second component that matches third mating surface irreversibly under the set conditions thereby forming a composite article of the first, second and third component articles.

3. A method as in claim 2, wherein the third component article includes a mating surface that matches a mating surface of the first component, the method involving allowing the third component to fasten to the first component via matching mating surfaces thereby forming a composite article of the first, second and third component articles in which each of the first, second, and third components articles is fastened to each of the other two articles irreversibly under the set conditions.

4. A method as in claim 1, the allowing step involving causing the first and second component articles to undergo random contact interactions with other component articles and with each other until the first and second mating surfaces are fastened to each other.

5. A method as in claim 1, the allowing step involving providing the first and second components at an interface of a first and a second fluid, the first fluid forming a meniscus at the mating surfaces, and allowing the first and second mating surfaces to come into proximity to the extent that the meniscus of the first fluid at the mating surfaces is eliminated.

6. A method as in claim 1, the allowing step involving providing the first and second components in a fluid that is incompatible with the mating surfaces, thereby creating a non-minimal free energy state, and allowing the mating surfaces to mate thereby minimizing contact between the fluid and the mating surfaces.

7. A method as in claim 1, wherein each of the first and second component articles includes an electrical conductor, the allowing step involving allowing the mating surfaces to mate and the electrical conductors of the respective components to be connected electrically.

8. A method as in claim 7, wherein each of the first and second component articles includes an electrical device in electrical communication with electrical conductor of the component, the allowing step involving establishing electrical communication between the electrical devices of the respective components thereby creating an electrical circuit useful for an electrical function.

9. A method as in claim 8, comprising providing at least three component articles each including an electrical device in electrical communication with an electrical conductor of the component, the allowing step involving establishing electrical communication between the electrical devices of the at least three components thereby creating an electrical circuit useful for an electrical function.

10. A method as in claim 1, the allowing step comprising allowing the first mating surface to fasten in register to the second mating surface.

11. A method as in claim 10, the allowing step comprising allowing the first mating surface to contact the second mating surface reversibly under the set conditions until the first mating surface is in register with and fastens to the second mating surface irreversibly under the set conditions.

12. The method of claim 1, wherein the chemically modifying involves modifying the first and second mating surfaces to be hydrophobic surfaces.

13. The method of claim 1, wherein the first and second components articles further comprise remainder surfaces, the first and second meeting surfaces each being compatible with the other and being incompatible with the remainder surfaces.

14. The method of claim 12, wherein the first and second component articles further comprise remainder surfaces, the chemically modifying involving modifying the remainder surfaces to be hydrophilic surfaces.

15. A method as in claim 5, further comprising exposing the component articles to a hydrophobic prepolymer fluid to coat the mating surfaces prior to providing the first and second components at the interface of the first and the second fluid.

16. A method as in claim 5, further comprising adding a prepolymer to the interface of the first and the second fluid.

17. A method as in claim 12, wherein the chemical modifying results in permanently affixing the mating surfaces to each other upon contact.

18. A method as in claim, 12, wherein the chemical modifying results in mating surfaces that are not permanently bonded to each other.

19. A method as in claim 18, further comprising fixing the mating surfaces to permanently affix the mating surfaces to each other.

20. A method as in claim 2, wherein the composite article of a first, second and third component articles provide a 3-dimensional self-assembly.

21. A method comprising:

providing a first component article having a maximum dimension, a total surface area, a first mating surface, and a remainder surface and a second component article having a maximum dimension, a total surface area, a second mating surface that matches the first mating surface, and a remainder surface, the first and second mating surfaces each being compatible with the other and being incompatible with the remainder surfaces and the first and second component articles separated by a distance at least equal to 1/100th of the maximum dimension of the first or second component article;

chemically modifying the first and second mating surfaces, such that the chemical modification provides better wetting of the mating surfaces; and without applying a net external force to either of the first and second component articles, and under set conditions, allowing the first mating surface to fasten to the second mating surface irreversibly under the set conditions thereby forming a composite article.

22. A self-assembly method comprising:

providing a first component article having a dimension of at least 150 nm, a total surface area, and a first mating surface and a second component article having a dimension of at least 150 nm, a total surface area, and a second mating surface that matches the first mating surface, the first and second mating surfaces each defining an area equal to at least one percent of the lesser of the total surface areas of the first and second component articles;

chemically modifying the first and second mating surfaces such that the chemical modification provides better wetting of the mating surfaces; and without applying a net external force to either of the first and second component articles, allowing the first mating surface to fasten to the second mating surface thereby connecting the first and second component articles to form a composite article.

* * * * *

UNITED STATES PATENT AND TRADEMARK OFFICE
CERTIFICATE OF CORRECTION

PATENT NO. : 6,507,989 B1
DATED : January 21, 2003
INVENTOR(S) : Ned B. Bowden et al.

It is certified that error appears in the above-identified patent and that said Letters Patent is hereby corrected as shown below:

Column 18,
Line 27, after "the first mating surface", add -- at least one of the first and second mating surfaces chemically modified for selective mating interaction --;
Lines 34-36, delete "chemically modifying the first and second mating surfaces such that the chemical modification provides better wetting of the mating surfaces --;
Lines 56 and 63, replace "involving" with -- comprising --;

Column 19,
Lines 1, 8, 16, 22, and 29, replace "involving" with -- comprising --;
Lines 41-42, delete "the chemically modifying involves modifying --;
Line 43, after the first occurrence of "surfaces", add -- are chemically modified --;
Line 46, replace "meeting" with -- mating --;
Lines 50-52, replace ", the chemically modifying involving modifying the remainder surfaces" with -- that are chemically modified --;

Column 20,
Line 2, replace "fluid" with -- fluids --;
Lines 3-4, delete "the chemical modiifying result in permanently affixing";
Line 5, after "faces", add -- permanently affix --;
Line 6, delete "," after "claim";
Lines 6-7, delete "chemical modifying results in";
Line 7, delete "that"'
Lines 9-10, delete "fixing the mating surfaces to";
Line 10, replace "affix" with -- affixing --;
Lines 20-21, delete "a total surface area,";
Line 23, replace "being" with -- chemically modified to be --;
Line 24, delete "being";
Line 25, replace "faces" with -- face for selective mating interaction --;

UNITED STATES PATENT AND TRADEMARK OFFICE
CERTIFICATE OF CORRECTION

PATENT NO. : 6,507,989 B1
DATED : January 21, 2003
INVENTOR(S) : Ned B. Bowden et al.

It is certified that error appears in the above-identified patent and that said Letters Patent is hereby corrected as shown below:

Column 20 cont.,
Lines 29-31, delete "chemically modifying the first and second mating surfaces, such that the chemical modification provides better wetting of the mating surfaces,";
Lines 44, after "first mating surface", add -- , at least one of the first and second mating surfaces chemically modified for selective mating interaction --; and
Lines 48-50, delete "chemically modifying the first and second mating surfaces such that the chemical modification provides better wetting of the mating surfaces;"

Signed and Sealed this

Fifth Day of October, 2004

JON W. DUDAS
*Director of the United States Patent and Trademark Office*